(12) United States Patent
Von Reitzenstein et al.

(10) Patent No.: US 11,751,343 B2
(45) Date of Patent: Sep. 5, 2023

(54) ELECTRONIC CONTROLLER ABLE TO BE EXPANDED IN A MODULAR MANNER

(71) Applicant: Continental Automotive GmbH, Hannover (DE)

(72) Inventors: Florian Von Reitzenstein, Laubach (DE); Christoph Kopp, Nuremberg (DE); Harsha Walvekar, Bangalore (IN)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 17/784,349

(22) PCT Filed: Nov. 9, 2020

(86) PCT No.: PCT/DE2020/200098
§ 371 (c)(1),
(2) Date: Jun. 10, 2022

(87) PCT Pub. No.: WO2021/115540
PCT Pub. Date: Jun. 17, 2021

(65) Prior Publication Data
US 2023/0051651 A1 Feb. 16, 2023

(30) Foreign Application Priority Data
Dec. 12, 2019 (DE) .................. 10 2019 219 478.8

(51) Int. Cl.
*H05K 9/00* (2006.01)
*B60R 16/023* (2006.01)
(Continued)

(52) U.S. Cl.
CPC ....... *H05K 5/0065* (2013.01); *B60R 16/0239* (2013.01); *H05K 1/0216* (2013.01); *H05K 5/0047* (2013.01); *H05K 9/0039* (2013.01)

(58) Field of Classification Search
CPC .................. B60R 16/0239; H05K 9/0039
See application file for complete search history.

(56) References Cited

U.S. PATENT DOCUMENTS 4,850,884 A * 7/1989 Sawai ............... H05K 7/026
361/752
5,134,546 A * 7/1992 Izumi ............. B60R 16/0239
361/736
(Continued)

FOREIGN PATENT DOCUMENTS

DE 10307082 A1 9/2003
DE 102010026953 A1 1/2012
(Continued)

OTHER PUBLICATIONS

Search Report dated Sep. 24, 2020 from corresponding German patent application 10 2019 219 478.8.
(Continued)

*Primary Examiner* — Hung V Ngo

(57) ABSTRACT

A modularly expandable electronic control unit comprises: an electronic circuit board on which a conductor track is disposed on a side in a region of lateral edges and enclosing an inner region and separating it from an outer region of the side, a housing having two halves for receiving the electronic circuit board. With the housing assembled, at least one housing half has an encircling electrically conductive shielding wall which rests on and establishes electrical contact with the conductor track and/or has at least one receptacle accessible from outside the assembled housing. The receptacle is disposed so the electronic module placed in the receptacle may be electrically connected to a module connection port disposed in the outer region of the electronic circuit board. The electronic circuit board has electrical
(Continued)

connections between the module connection port and one or more electronic assemblies disposed on the inner region.

13 Claims, 10 Drawing Sheets

(51) Int. Cl.
*H05K 5/00* (2006.01)
*H05K 1/02* (2006.01)

(56) References Cited

U.S. PATENT DOCUMENTS

| | | | |
|---|---|---|---|
| 5,684,340 A | 11/1997 | Soler et al. | |
| 6,267,606 B1* | 7/2001 | Poplawski | G02B 6/4277 |
| | | | 361/752 |
| 10,779,395 B1* | 9/2020 | Harrigan | H05K 9/0026 |
| 2004/0235317 A1* | 11/2004 | Schiefer | H05K 3/301 |
| | | | 439/76.2 |
| 2005/0052858 A1* | 3/2005 | Shima | H04B 15/00 |
| | | | 361/814 |
| 2008/0115967 A1 | 5/2008 | Giboney et al. | |
| 2008/0130259 A1 | 6/2008 | Hederoth | |
| 2013/0120944 A1 | 5/2013 | Graf | |
| 2013/0343018 A1* | 12/2013 | Hattori | H05K 5/0065 |
| | | | 361/755 |
| 2017/0334375 A1* | 11/2017 | Shigyo | H01R 24/76 |
| 2017/0354048 A1 | 12/2017 | Hashbarger et al. | |
| 2018/0006416 A1* | 1/2018 | Lloyd | H05K 7/1487 |
| 2020/0266612 A1* | 8/2020 | Joyce | H02B 1/04 |
| 2021/0399501 A1* | 12/2021 | Balana Avila | H01M 50/287 |

FOREIGN PATENT DOCUMENTS

| | | |
|---|---|---|
| DE | 102010035081 A1 | 2/2012 |
| EP | 1782667 A1 | 5/2007 |
| EP | 2594122 A2 | 5/2013 |
| JP | 2002198671 A | 7/2002 |
| JP | 2008131034 A | 6/2008 |
| JP | 2013051133 A | 3/2013 |
| JP | 2014013079 A | 1/2014 |
| JP | 2019009457 A | 1/2019 |

OTHER PUBLICATIONS

International Search Report and Written Opinion dated Feb. 22, 2021 from corresponding International patent application No. PCT/DE2020/200098.

Search dated Apr. 17, 2023 from corresponding Japanese patent application No. 2022-532605.

Notice of Reasons for Refusal dated Apr. 17, 2023 from corresponding Japanese patent application No. 2022-532605.

* cited by examiner

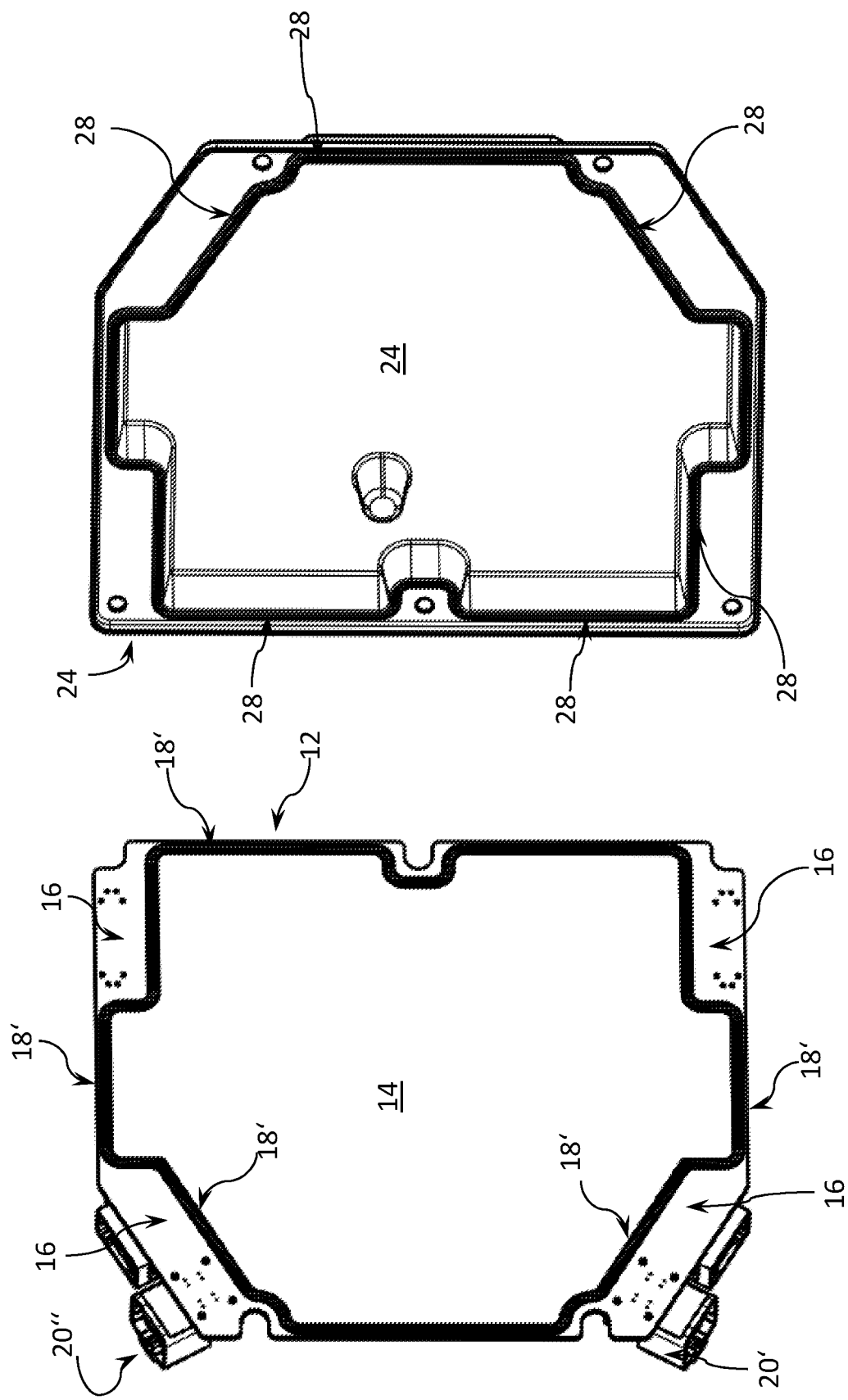

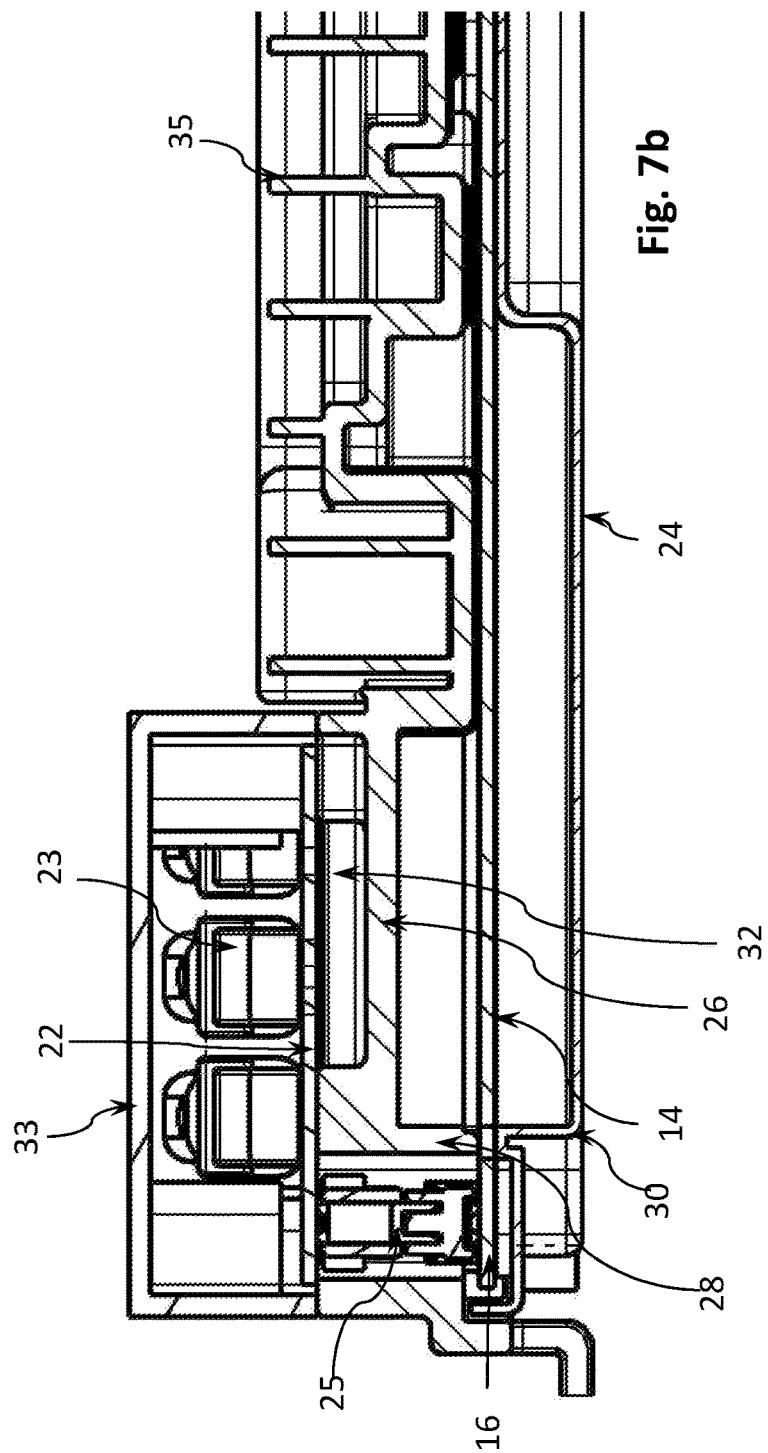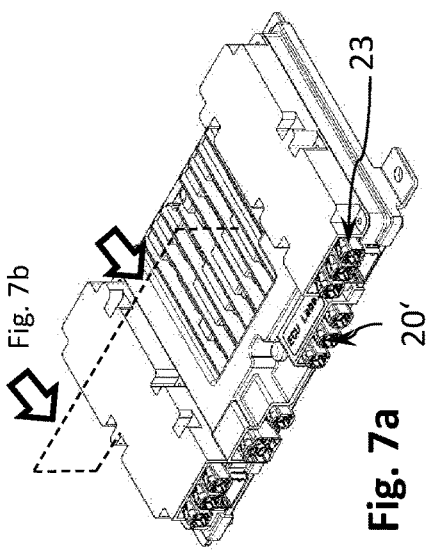

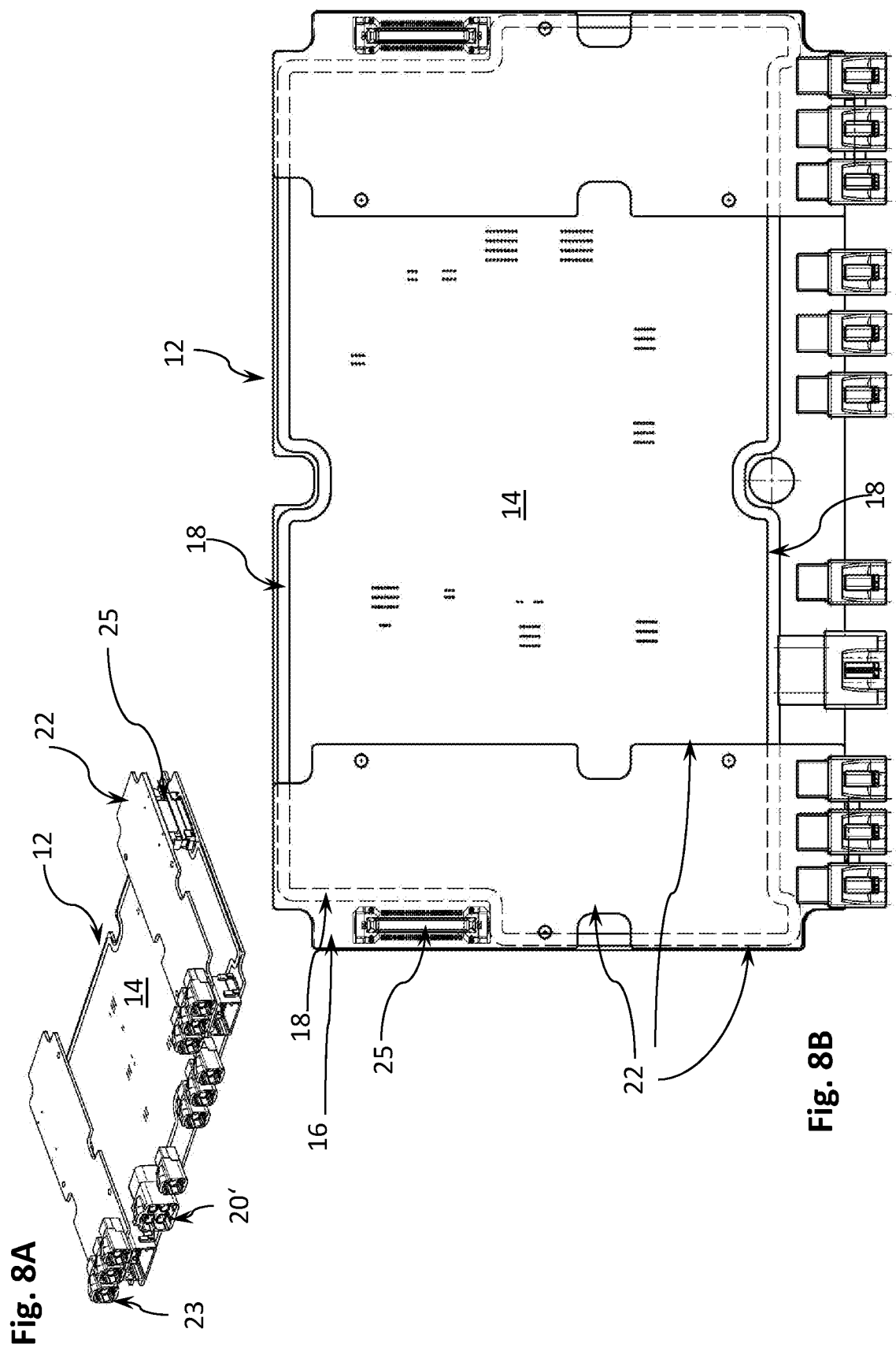

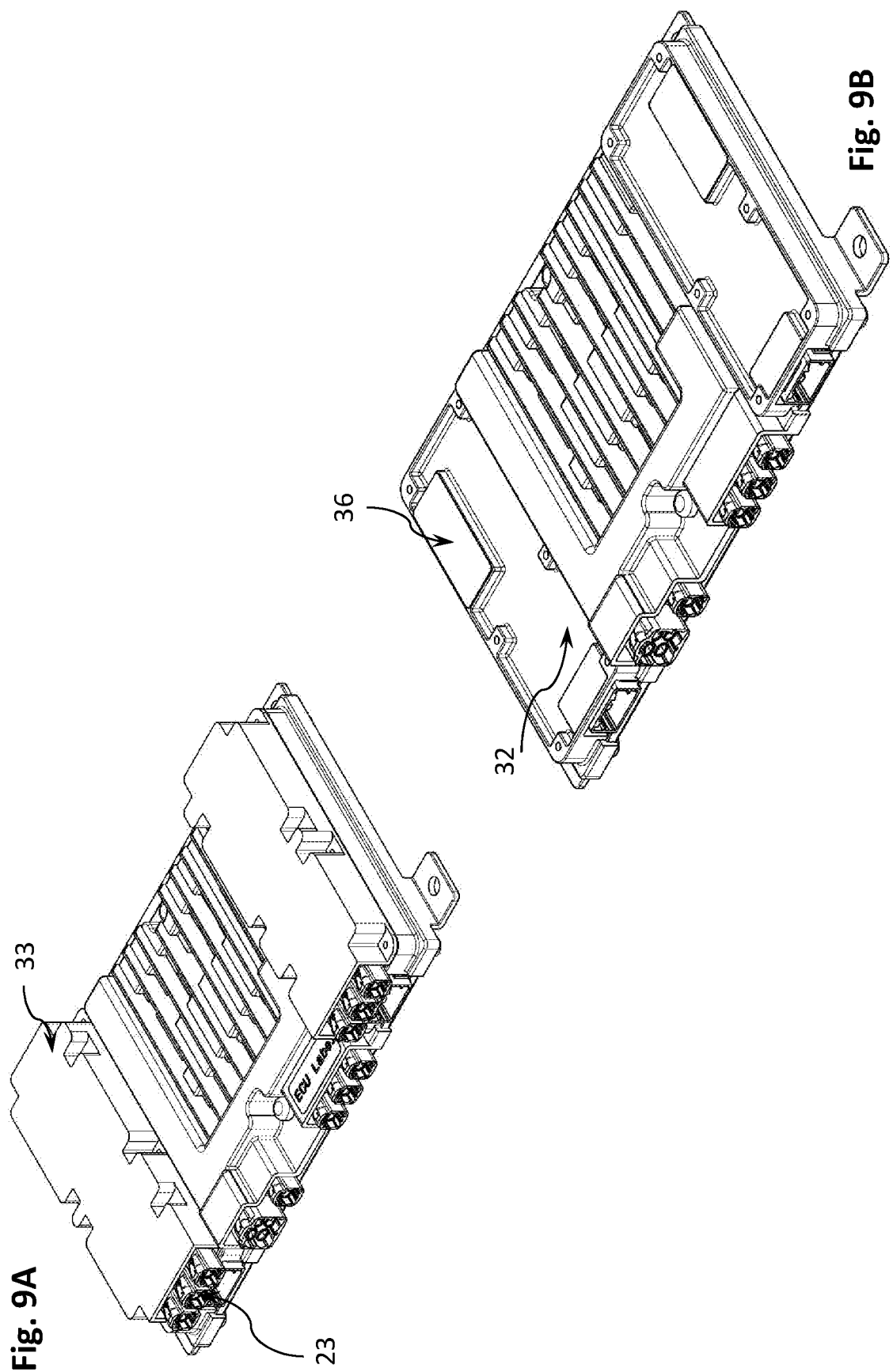

ELECTRONIC CONTROLLER ABLE TO BE EXPANDED IN A MODULAR MANNER

The present disclosure relates to a modularly expandable electronic control unit, in particular for use in motor vehicles.

Electronic control units (ECU) are mainly used in automotive engineering for various closed-loop and open-loop control tasks and typically have one or a plurality of electronic circuit boards that are housed in a housing for protecting the electronics. Control units used in motor vehicles must be designed for different environmental influences, depending on the installation location. For example, a control unit located near a heat source such as an internal combustion engine must be designed for a wide temperature range in order to protect the sensitive electronics from damage caused by excessive external temperatures. A control unit disposed in an installation location with a high influence of moisture must be correspondingly sealed against the ingress of moisture into the electronics. Protection against dust and other contaminants in particular is also important for a control unit, for example to prevent short circuits and fire. Moreover, due to the increasing density of electronics in motor vehicles, control units must also be designed for appropriate electromagnetic compatibility (EMC). In order to meet these different requirements for control units in the automotive environment, the housings of the control units are usually specially adapted to the electronics to be accommodated and the installation location.

For example, EP 2594122 A2 shows an electronic control unit for the automotive sector, in which two metal housing halves enclose an inner region of the printed circuit board on both sides and are placed on an encircling metal track, so that the sensitive electronics inside are protected and electrical contact is made by way of connections which are disposed outside the housing. However, modular expandability is not provided.

In order to expand an electronic control unit with additional systems, these systems can be integrated as additional modules by means of so-called board-to-board plug connectors in the same housing as the main electronic part or main module. Board-to-board plug connectors are special board-mounted plug connectors used to electrically connect two or more electronic circuit boards.

However, this type of system integration at the module level can cause the following issues: Freedom from interference can often not be guaranteed for EMC and thermal reasons, since an added module can affect the behavior of the main module in comparison to the normal operation of the main module without an integrated system on the module. Adding a system to a module of a control unit after the control unit has been produced is problematic, for example because the warranty of the control unit cannot usually be maintained by the manufacturer. The flexibility in terms of adding modules to an existing control unit is limited.

For example, DE 10307082 A1 discloses a control unit for the on-board electrical system of a motor vehicle, in which a plug-in card slot for inserting additional devices or modules is provided within the housing. However, further details about the housing, the EMC shielding, etc. cannot be found.

EP 1782667 A1 describes a concept for a base station for telecommunications transmission, the requirements thereof with regard to dirt, temperature and EMC influences not being equitable with those in the automotive sector in the first place. Although modular expansions are described, the details of the design embodiment remain unclear. While FIG. 4 thereof shows a schematic exploded drawing of a basic assembly 402 with an opening in the central region, the dimensions of which should probably fit the internal antenna 403 shown as a block and which can probably be closed by a common cover 404, the type of the opening, electrical connections between the parts as well as any potential shielding cannot be derived in more detail here.

FIG. 12 et seq. show another exemplary embodiment in which individual segments are formed within the housing and on the printed circuit board and the segments are mutually shielded from one another by way of corresponding shielding walls and electrical ground conductor tracks on the printed circuit board. An optional additional printed circuit board 1210 for a transmission interface is provided here in FIG. 12, the former being able to be connected within the corresponding segment by way of connector plugs 1211 when the housing is opened. In a central region of the housing, 1209 shows an unspecified mechanical interface to an optional internal antenna, wherein the position unequivocally differs from that of the additional printed circuit board 1210, and moreover again the type of opening, electrical connections between the parts and any potential shielding cannot be derived in more detail here.

A modularly expandable electronic control unit, in particular for use in motor vehicles, will now be described hereunder.

According to a first aspect, a modularly expandable electronic control unit is disclosed, having the following: an electronic circuit board in which a conductor track is disposed on at least one side in the region of the lateral edges of the electronic circuit board, said conductor track enclosing a first, inner region of the side and separating the latter from an outer region of the side. This outer region therefore lies in the region of the lateral edges of the electronic circuit board and thus on the face which is spatially outside the inner region surrounded by the conductor track, the latter as a grounding track preferably being electrically connected to the electric earth connection. At least one module connection port for electrically connecting the electronic circuit board to at least one electronic module is disposed in this outer region.

The housing has two halves for receiving the electronic circuit board. At least one half of the housing here has an encircling, at least partially electrically conductive shielding wall which in the assembled state of the housing rests at least partially on the conductor track disposed at least on one side of the electronic circuit board, and causes electrical contact to be established between the conductor track and the at least partially electrically conductive shielding wall of the respective housing half.

At least one housing half on the outside, thus on the external side facing away from the housing interior and separated by the housing wall, has at least one receptacle which for the at least one electronic module is accessible from outside the housing in the assembled state.

The at least one receptacle is disposed such that the at least one electronic module optionally, i.e. additionally, placed in the receptacle can be electrically connected to the at least one module connection port disposed in the outer region of the electronic circuit board. The electronic circuit board has electrical connections between the at least one module connection port and one or a plurality of electronic assemblies disposed on the inner region. The receptacle is formed on the outside, preferably also in the shape of a recess in the wall of the housing half that accommodates the electronic module, wherein the wall of the housing half is in any case disposed in the inner region of the electronic circuit board, between the electronic module in the receptacle and the electronic circuit board. The electronic module in the receptacle here is preferably disposed parallel to the electronic circuit board such that a first part of the electronic module covers the inner region of the electronic circuit board, wherein the wall of the housing is located therebetween, as already explained above. A second part of the electronic module, i.e. one that differs from the first part, is disposed above the outer region of the electronic circuit board and there is connected to the electronic circuit board by an opening having the at least one module connection port. The electronic circuit board can be a multi-layer board. The electrical connections between the at least one module connection port and one or a plurality of electronic assemblies disposed on the inner region can in this instance be implemented in one or a plurality of inner layers of the multi-layer circuit board.

In particular, the electronic circuit board can be designed to implement standard functions of the control unit, and the at least one module connection port by way of an electronic module connected thereto can be designed to implement further functions of the control unit by way of the connected electronic module.

The control unit can be designed in such a way that an electronic module connected to the at least one module connection port can be exchanged without disassembling the housing halves of the housing of the control unit. The two housing halves here, preferably by way of the shielding walls, rest in an encircling manner on the electrical conductor tracks and seal the inner region of the electronic circuit board in an EMC-tight manner. The optional electronic module is disposed in the receptacle thereof on the outside of at least one of the housing halves and is accessible thereon, and is able to be connected by way of the module connection port that is also located in the outer region, without any of the housing halves having to be opened.

At least one of the receptacles can be configured to accommodate an electronic module having a cooling element.

Protective covers which are configured to be attached to one of the housing halves can be provided for the receptacles.

At least one of the housing halves can have an integrated heat sink for cooling at least one assembly disposed on the electronic circuit board.

At least one cable connection port can be disposed in the outer region of the electronic circuit board, and the electronic circuit board can have electrical connections between the at least one cable connection port and one or a plurality of electronic assemblies disposed on the inner region, wherein at least one housing half has one receptacle for each cable connection port.

The at least one cable connection port can be disposed in a corner region of the electronic circuit board, and each cable connection port can in particular be disposed in a corner region of the electronic circuit board in such a manner that the insertion direction of each cable connection port is at an angle of approximately 45° to the lateral edges of the electronic circuit board in the lateral plane.

In a further preferred design embodiment, as long as no electronic module is fitted in a receptacle on the outside of the housing, a protective cover is provided which, disposed inside the receptacle, covers the opening to the at least one module connection port. This protective cover here is of course smaller than the protective cover that would extend over the receptacle and the electronic module inserted therein, but at the same time protects against external influences the region of the module connection port or of connector plugs already pre-assembled thereon. In addition, this inner protective cover can be designed much more simply, e.g. as an adhesive foil, optionally with a metallic intermediate layer for the EMC effect, or said inner protective cover can also be designed so as not to be non-destructively removable and thus serve as evidence of manipulation, i.e. damage or manipulation would be documented if the protective cover was destroyed and the warranty would be rendered void.

Disclosed according to a further aspect, is an electronic module which is configured to expand the functionality of a control unit as disclosed herein and has an electronic circuit board, wherein a connection port is disposed on one side of the electronic circuit board in such a manner that when placing the electronic circuit board in a receptacle of a housing half of the control unit, the connection port electrically contacts a module connection port of the electronic circuit board of the control unit.

Further features are derived from the following description in connection with the exemplary embodiment illustrated in the drawings.

BRIEF DESCRIPTION OF THE DRAWING

In the drawing

FIG. 5B shows a plan view of the inside of the upper housing half, and FIG. 5A shows a plan view of the upper side of the electronic circuit board of the control unit shown in FIG. 1.

FIG. 7A schematically shows a further design embodiment and the location of the section which is shown in detail in FIG. 7B;

FIG. 7B shows a section through part of the assembly according to FIG. 7A;

FIG. 8A shows a three-dimensional illustration of the shape and location of the electronic circuit board and of optional electronic modules according to the design embodiment according to FIG. 7A without a housing;

FIG. 8B shows a plan view of the location of the electronic circuit board and of optional electronic modules according to the design embodiment according to FIG. 7A without a housing;

FIG. 9A shows a design embodiment having two optional electronic modules;

FIG. 9B shows a design embodiment without optional electronic modules and a receptacle remaining open, but having protective cover within the receptacle for the opening to the module connection port;

DETAILED DESCRIPTION

In the following description, identical, functionally identical and functionally related elements can be provided with the same reference signs. Absolute values are indicated below merely by way of example and are not to be understood as limiting.

Figure 1:
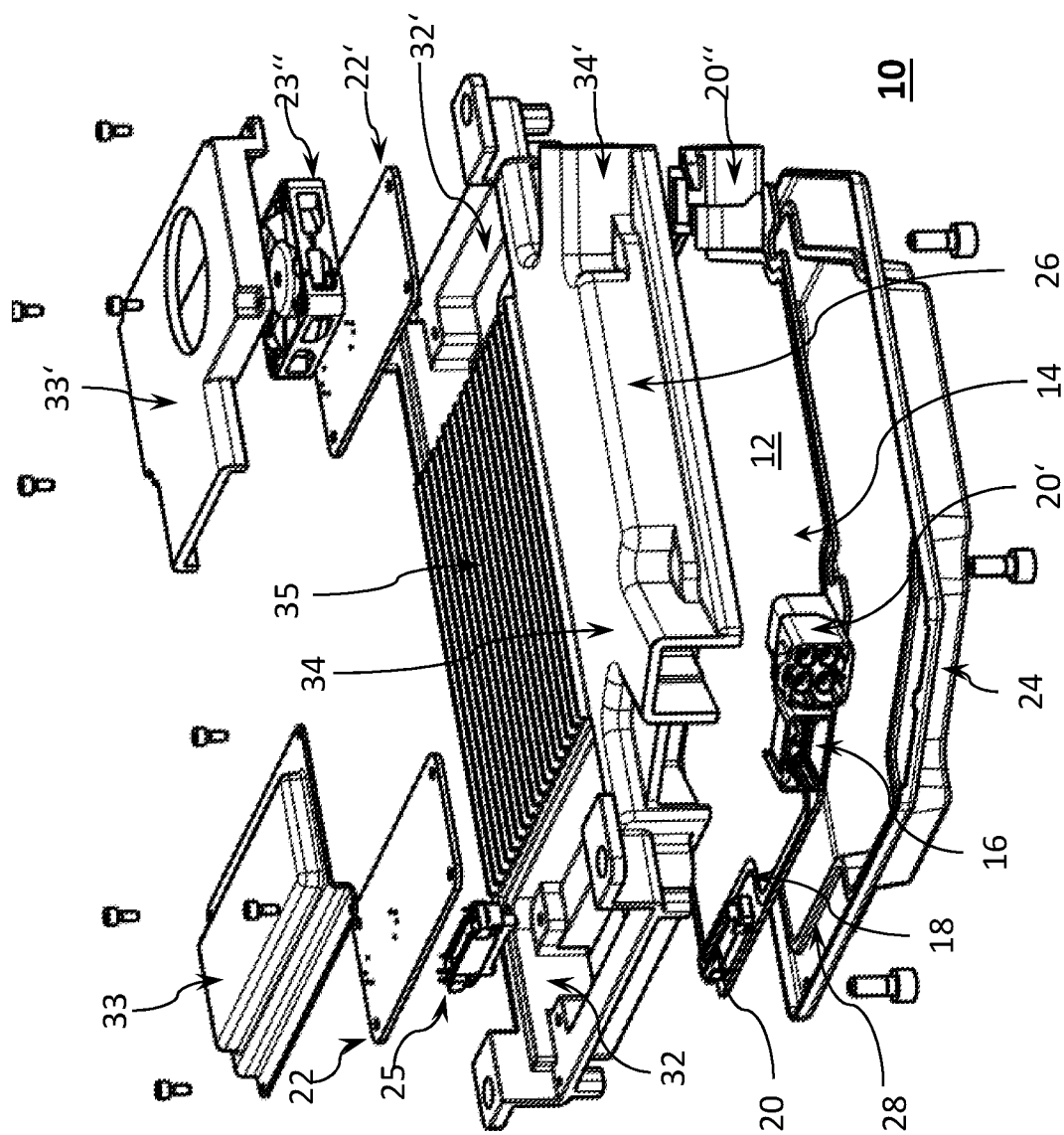
FIG. 1 shows an exploded illustration of an exemplary embodiment of a modularly expandable electronic control unit in a perspective view obliquely from above.
Figure 2:
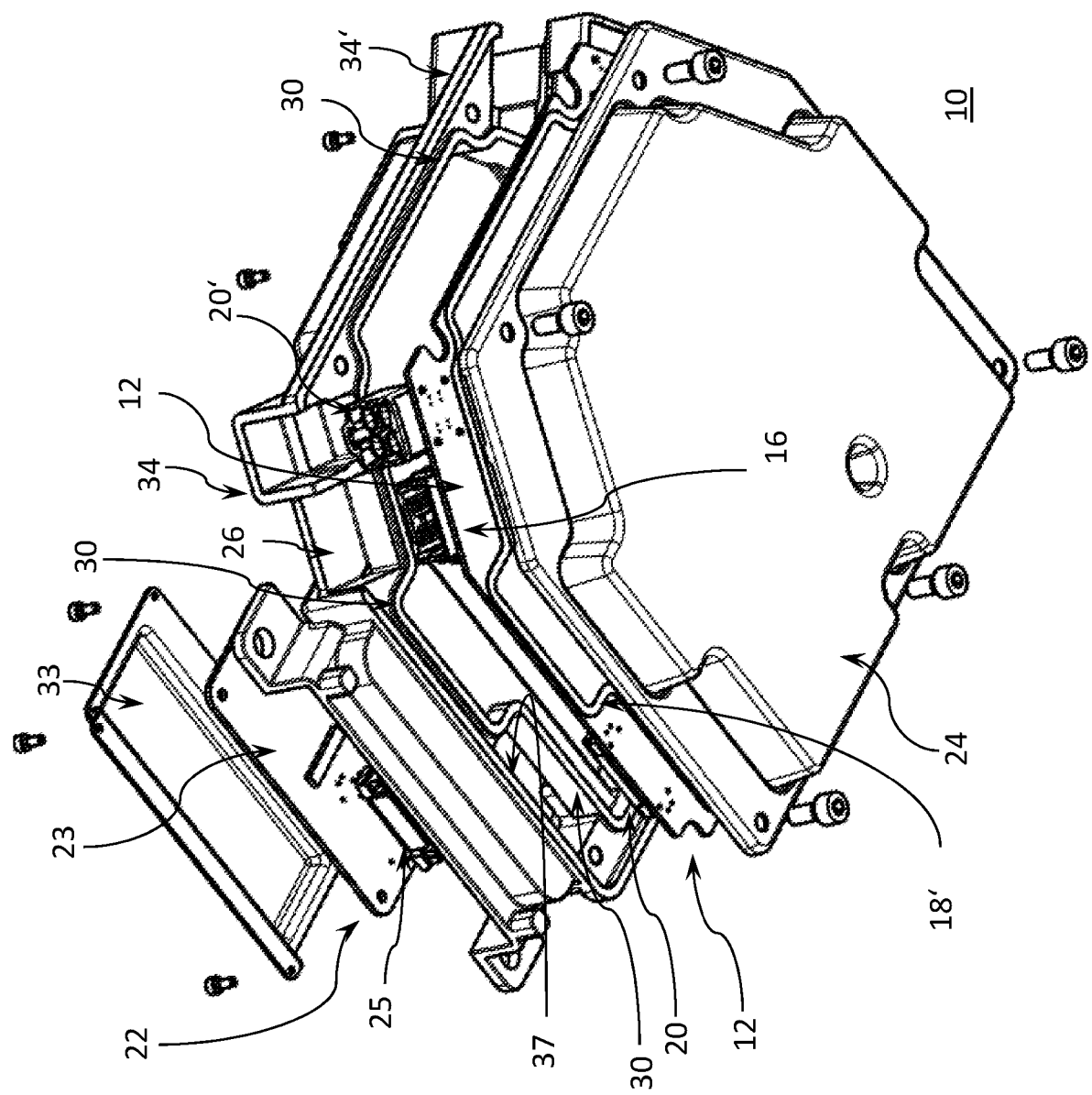
FIG. 2 shows a further exploded illustration of the exemplary embodiment shown in FIG. 1 in a perspective view obliquely from below.

A control unit 10 which is modularly expandable by additional electronic modules is shown in a perspective view in FIGS. 1 and 2.

The control unit 10 has an electronic circuit board 12 which forms the main module of the control unit 10 and implements standard functions of the control unit. The electronic circuit board 12 on both sides, i.e. the upper side and the lower side thereof, can have a conductor track 18 which is disposed in the peripheral region of the electronic circuit board 12 and encircles the entire electronic circuit board 12 so that an inner region 14 and an outer region 16, separated from the latter by the conductor track 18, are formed by this, in particular closed, conductor track 18. The electronic circuit board 12 on both sides, that is to say on the upper side and the lower side thereof, can in particular also be populated with electronic components.

Figure 6B:
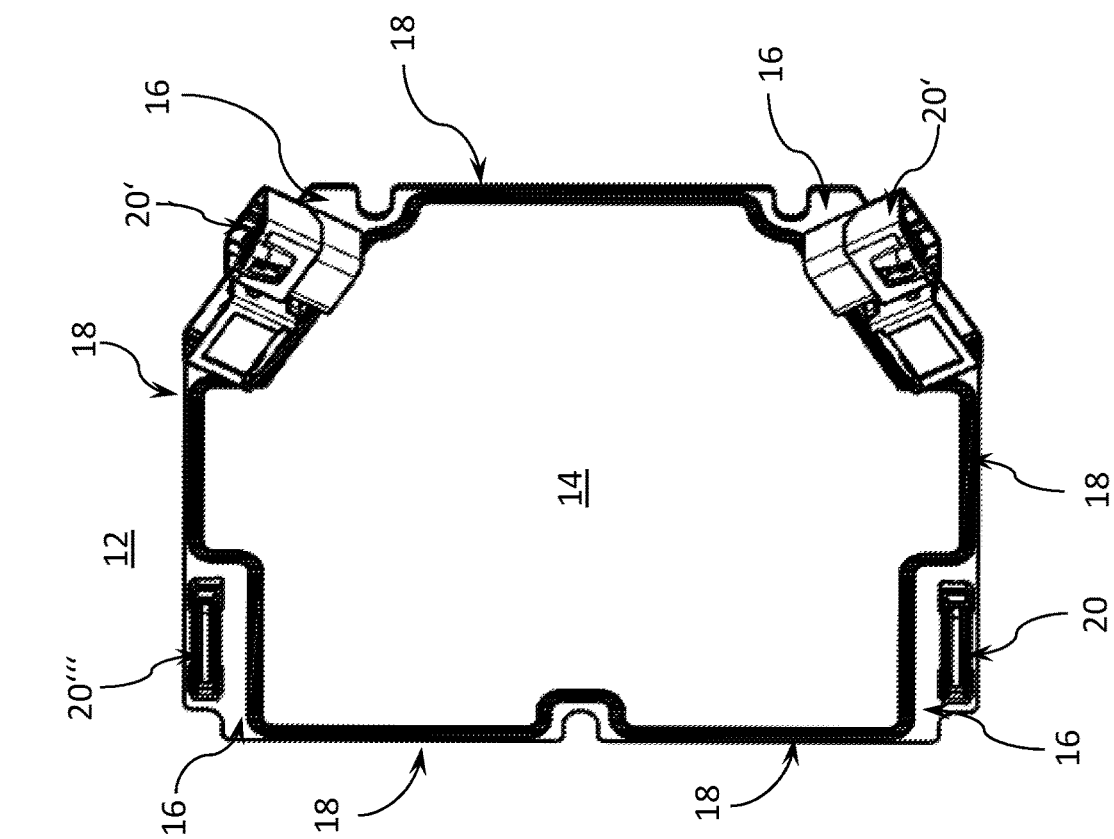
FIG. 6B shows a plan view of the lower side of the electronic circuit board of the control unit shown in FIG. 1.

The conductor track 18 is provided as a grounding track. FIGS. 5A and 6B show an example of the electronic circuit board 12 on which the conductor track 18 is disposed in an encircling manner in the peripheral region on the upper side of the circuit board 12 (FIG. 5A) and another conductor track 18' is likewise disposed in an encircling manner in the peripheral region on the lower side of the electronic circuit board 12 (FIG. 6B).

In the outer region 16 of the electronic circuit board, one or a plurality of module connection ports 20 and 20''' and/or one or a plurality of cable connection ports 20', 20'' can be disposed on the upper side and/or the lower side of said electronic circuit board. The cable connection ports 20', 20'' can in particular each be disposed in a corner region of the electronic circuit board 12, and in particular in such a way that the insertion direction of said cable connection ports 20', 20'' has an angle of approximately 45° to the lateral edges of the electronic circuit board 12 in the lateral plane thereof, as a result of which the ingress of water and dirt or dust is mechanically prevented without any further sealing measures ("umbrella principle"). Electronic components and/or assemblies can be disposed in the inner region 14.

The components/assemblies on the inner region 14 can be electrically connected to a module connection port 20, 20''' by way of one or a plurality of lines, which are embodied by way of one or a plurality of inner layers of the, in particular multi-layer, electronic circuit board 12, so that the conductor tracks 18 and 18', when viewed perpendicularly to the plane of the electronic circuit board 12, include the inner layers of the electronic circuit board 12.

Figure 6A:
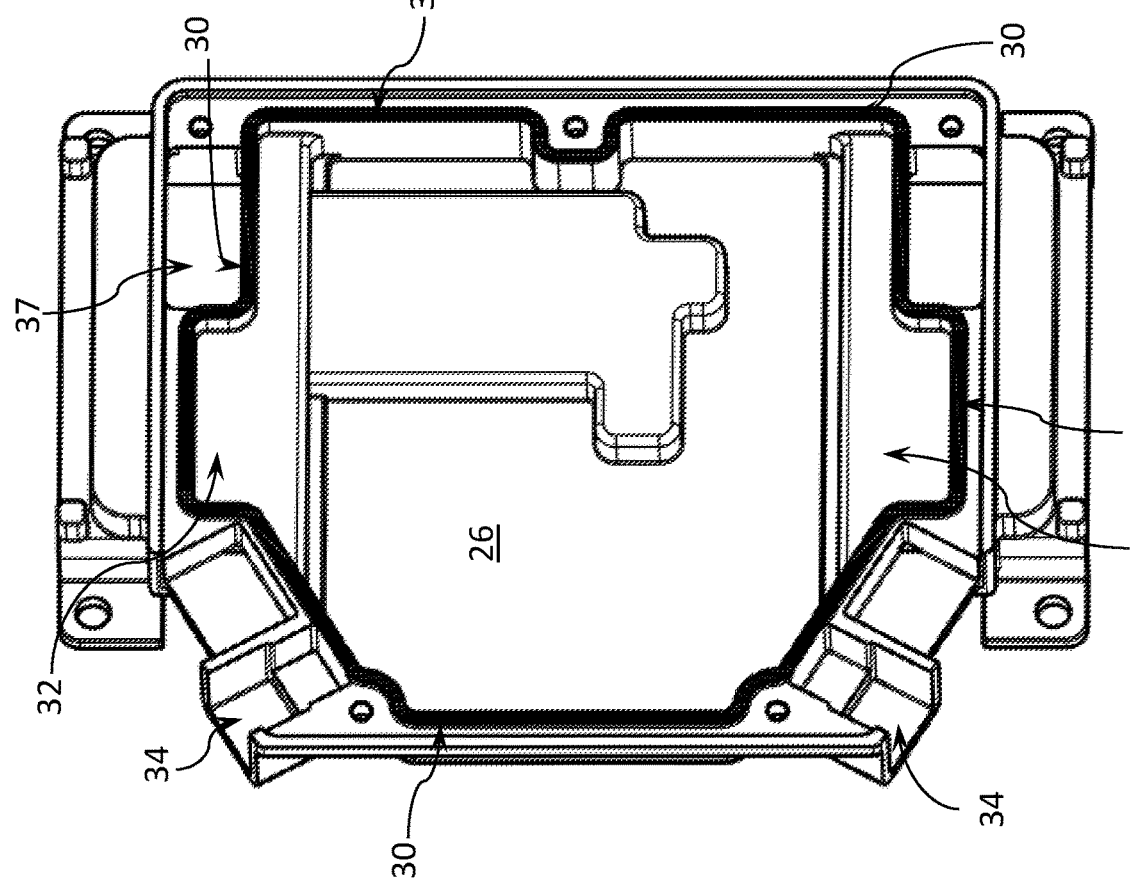
FIG. 6A shows a plan view of the inside of the lower housing half.

The housing of the control unit 10 has two housing halves 24 and 26: FIG. 5B shows a plan view of the inside of the first housing half 26; FIG. 6A on the right shows a plan view of the inside of the second housing half 24. Both housing halves 24, 26 each have an encircling, at least partially electrically conductive shielding wall 28 and 30, respectively. The shielding wall 28 can be formed so as to be integral to the respective housing half 24, 26, and in particular can be composed of the same material as the housing half 24, 26. For electrical shielding, the shielding wall 28 can be formed from a conductive material such as copper, or be coated with such a material.

In the assembled state of the housing, when both housing halves 24 and 26 are joined together and electronic circuit board 12 is disposed in the housing, the shielding wall 28 of the housing halves 24 and 26 rests at least partially on the conductor track 18 and 18', so that electrical contact is established between the conductor track 18, 18' and the shielding wall 28 of the respective housing half 24, 26.

As a result, the inner region 14 of the electronic circuit board 12 on the upper side and the lower side can be effectively shielded from EMC influences by the housing halves 24, 26 and the shielding wall 28.

The upper housing half 26 has receptacles 32 and 32' for electronic modules 22 and 22', respectively, so as to expand the functionality of the main electronic circuit board 12 of the control unit 10. The receptacles 32 and 32' are accessible from outside the housing and are provided on the external wall of the housing half 26 in such a manner that in the assembled state of the housing the module connection ports 20, 20''' are accessible by way of these receptacles 32, 32', and an electronic module 22 placed in a receptacle by way of a connector 25 can be contacted by the module connection port 20 present in the respective receptacle. Whether the connector 25 is already preassembled on the module connection port 20 or on the electronic module 22 is irrelevant for the function.

However, it should be emphasized that the positions of the module connection ports 20, 20''' on the main electronic circuit board 12 are disposed in the outer edge region 16 and thus separately from the protected inner region 14.

The electronic modules 22, 22' can be configured to expand the functionality of the electronic circuit board 12, for example to provide customer-specific software and/or hardware. Data can be exchanged between the electronic module 22 and the electronic circuit board 12 by way of an electronic interface provided by the connector 25 and the module connection port 20; for example, the electronic interface can provide a bus connection between the electronic circuit board 12 and the electronic module 22, and a processor on the electronic module 22 can run custom software that can extend the functionality of electronic circuit board 12 with additional features. Likewise, the electronic module 22' can be connected to the electronic circuit board 12 by way of an electronic interface. As can be seen in FIG. 1, the electronic module 22' can be cooled by a cooling element such as a fan 23''. In particular, the fan 23'' can be disposed above an assembly that during operation generates waste heat which has to be discharged by the fan 23''.

A cooling element such as a fan can also be disposed on the electronic module 22, if the installation space is available for this. It is also conceivable that the electronic module 22' has no other function and is only used to connect a cooling element, in particular an active fan, this in particular making it possible to use the control unit under very demanding thermal conditions where a correspondingly high cooling capacity is required. Active convection can also improve the overall thermal load capacity of the assembly.

The receptacles 32 and 32' can be closed with protective covers 33 and 33' in order to protect the electronic modules 22, 22' from external influences such as excessively high or excessively low temperatures, moisture, dirt, etc. The protective covers 33, 33' can in particular also be made from a conductive material in order to shield the electronic modules 22, 22' from EMC influences. The protective covers 33, 33', for example by means of rubber seals, can also be configured so that they seal the receptacles 32, 32' in order to prevent any ingress of moisture. At least one opening for discharging waste heat from the receptacle closed by the protective cover can be provided in a protective cover, such as, for example, the opening in the cover 33" above the fan 23" for discharging waste heat that is discharged from the receptacle 32' by the fan 23" of an assembly.

The upper housing half 26 can also have receptacles 34, 34' for the cable connection ports 20', 20", which can be designed in such a way that said receptacles 34, 34' shield the cable connection ports 20', 20" from external influences such as moisture, EMC and also mechanical loads.

Furthermore, the upper housing half 26 can have an integrated heat sink 35, in particular in the shape of cooling fins, which can be used to cool at least one assembly disposed on the upper side and/or the lower side of the electronic circuit board 12. Assemblies disposed on the lower side of the electronic circuit board 12 can be cooled from below and have a thermal connection to the heat sink 35 on the upper side of the electronic circuit board 12.

Figure 3:
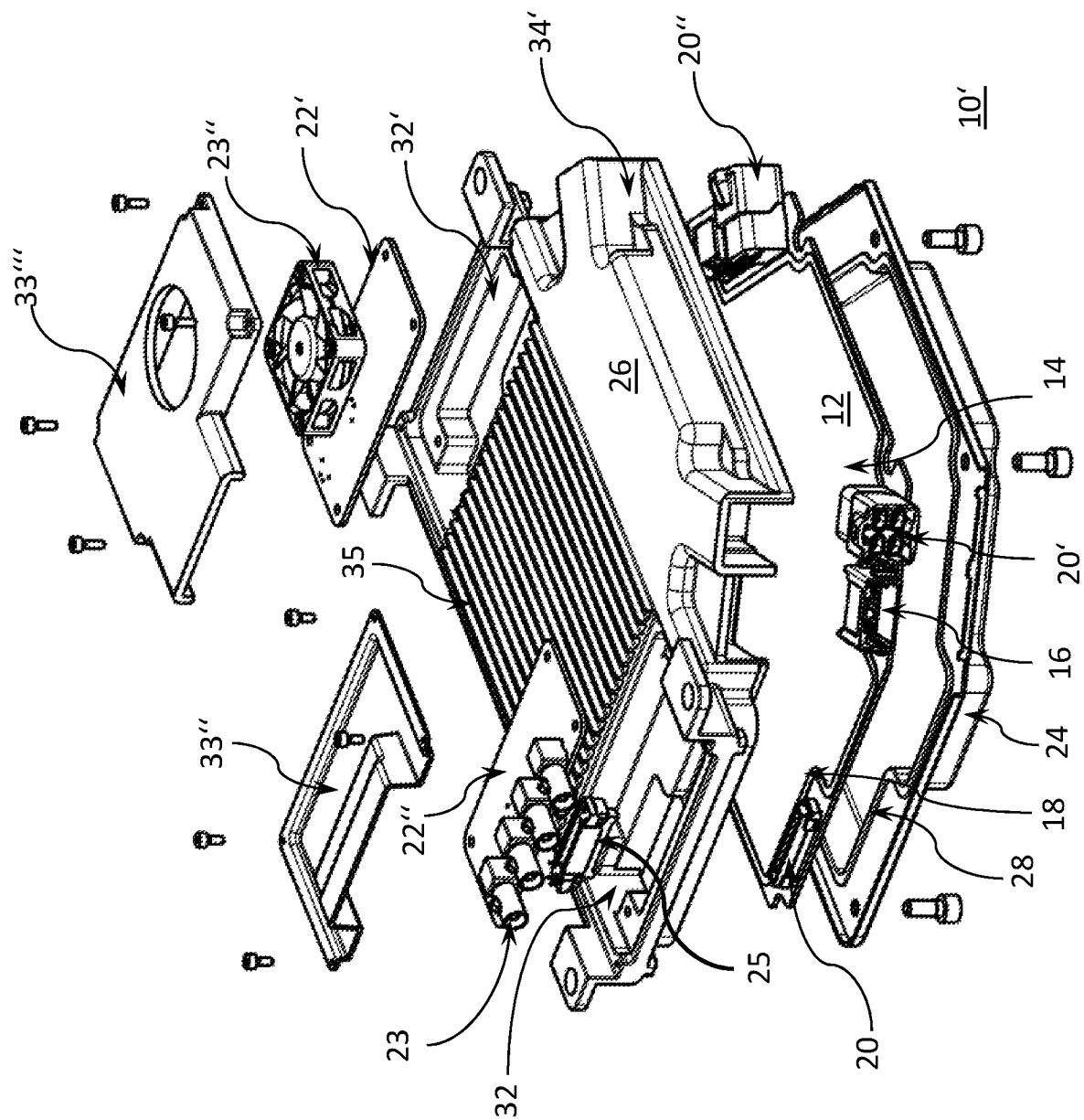
FIG. 3 shows an exploded illustration of a further exemplary embodiment of a modularly expandable electronic control unit in a view obliquely from above.

FIG. 3 shows a perspective view of a control unit 10' which, like the control unit 10 shown in FIGS. 1 and 2, is modularly expandable with additional electronic modules and differs from the latter in that another electronic module 22" with electrical plug-in connections 23 is placed in the receptacle 32, and accordingly differently designed protective covers 33", 33'" are used to cover the receptacles 32, 32'. The protective cover 33" here is configured in such that it enables access to the electrical plug-in connections 23 of the electronic module 22" from outside the control unit 10'.

Figure 4:
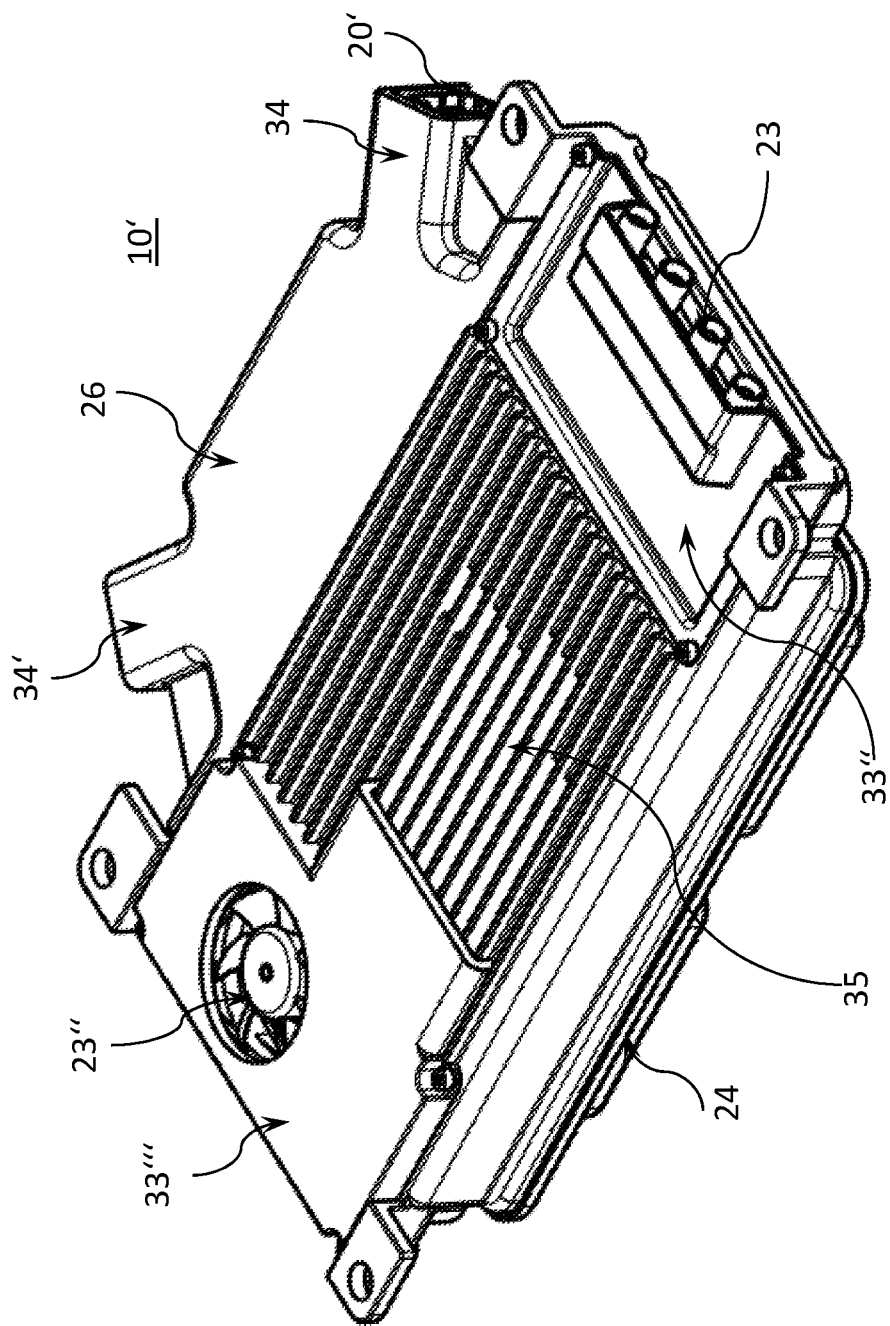
FIG. 4 shows a perspective illustration of the further exemplary embodiment of a modularly expandable electronic control unit from FIG. 3 in the assembled state.

FIG. 4 shows this control unit 10' in the assembled state, i.e. with the housing halves 24 and 26 assembled and protective covers 33" and 33'" fitted over the receptacles for the electronic modules.

The orientation of the cable connection ports provided in the receptacles 34, 34', the main plug-in axes of which run at an angle of approximately 45° to the lateral edges of the control unit 10', can also be clearly seen in FIG. 4. As a result, the cable connection ports on both sides of the control unit 10, 10' are aligned downwards by approximately 45°, which can be advantageous for the installation in a motor vehicle.

With reference to FIGS. 5 and 6, the mirror-symmetrical profile of the conductor track 18, 18' on the corresponding side of the electronic circuit board 12 in relation to the respective conductive shielding wall 28, 30 should be pointed out again. In the assembled state of the control unit, when both housing halves 24 and 26 are assembled and the electronic circuit board 12 is situated between the housing halves, the encircling and at least partially electrically conductive shielding walls 28, 30 rest at least partially on the conductor track 18, 18' on the corresponding side of the electronic circuit board 12, so that the inner region 14 of the electronic circuit board 12 can be efficiently shielded from EMC influences by the shielding walls 28, 30 and the housing halves 24, 26. In particular, the inner region 14 can be electrically shielded from the outer region 16 so that EMC influences from the electronic modules 22, 22', 22" and optionally the cable connection ports 20', 20" on the inner region 14 can be avoided or at least suppressed.

The position of the module connection ports 20 on the electronic circuit board 12 for connecting optional electronic modules in the outer region 16 outside the inner region 14 shielded by the conductor track 18 having the shielding wall 30 can also be clearly identified in FIG. 6B. The housing half 26 is therefore also closed above the inner region 14, i.e. as a result of the wall of the housing the receptacle 32 on the outside of the external wall is shielded from the inner region thereof and in particular from the inner region 14 of the electronic circuit board 12.

FIG. 7A schematically illustrates a further design embodiment of the invention, in which the cable connection ports 20', 20" and optional electrical plug-in connections 23 on the optional electronic modules 22 are all disposed on the same side of the housing, this being irrelevant for the basic functions. FIG. 7A serves primarily to clarify the location of the section shown in detail in FIG. 7B.

Thus, FIG. 7B shows a section through part of the assembly according to FIG. 7A. Beginning from the bottom in FIG. 7B, the lower housing half 24 is shown, the latter showing a chamber above the inner region 14 of the main electronic circuit board 12, in which chamber assemblies on this main electronic circuit board 12 can be disposed in a protected manner. This chamber is delimited laterally by the shielding wall 30. As already explained, the shielding wall 30 extends to the lower side of the main electronic circuit board 12 and on the latter is in contact with the grounding conductor track 18. On the upper side of the main electronic circuit board 12, a chamber for components on the main electronic circuit board 12 is also formed by the upper housing half 26, said chamber again being protected laterally by the corresponding shielding wall 28 and by the wall of the housing 26 at the top, both in relation to the environment as well as in relation to the optional electronic module 22 which is disposed in the receptacle 32. The receptacle 32 is thus disposed on the outside of the housing which is closed per se.

As can be seen readily in FIG. 7B, the main electronic circuit board 12 extends laterally beyond the inner region 14 (the border can be seen through the two outer walls 28,30) into the outer region 16, where the connector 25 for the connection between the optional electronic module 22 and the module connection port located on the main electronic circuit board is disposed. As a result, it is possible to ship the control unit purely with the main electronic circuit board 12 fully protected by the two closed housing halves 24, 26, for example between suppliers and OEMs, or even to use said control unit even when no electronic modules 22 are required. In addition, however, the control unit 10 can be retrofitted at any time with an electronic module 22 or be replaced by a new one without the housing halves 24, 26 having to be opened. In this way, the inner region 14 is and remains permanently protected. Only the additional outer shielding 33 is optionally opened for this purpose.

FIG. 8A shows a three-dimensional illustration of the shape and the location of the electronic circuit board 12 and optional electronic modules 22 according to the design embodiment according to FIG. 7A without the housing halves 24 and 26. However, this FIG. 8A primarily serves for a better understanding of FIG. 7B. Specifically, FIG. 8B shows the exact plan view of the location of the optional electronic modules 22 above the various regions (14, 16) of the electronic circuit board according to the design embodiment according to FIG. 7A. It is particularly important here to follow the course of the grounding track 18 on the main electronic circuit board 12, said course being directly visible in the central region of FIG. 8B, but below the region of the electronic modules 22 is continued here in a schematic manner with dashed lines so as to ultimately highlight the location of the inner region 14 in relation to the outer region 16 on the (main) electronic circuit board (12). Specifically, the electronic module 22 is disposed such that a first part of the electronic module 22 covers the inner region 14 of the electronic circuit board (12). There, the wall of the housing half 26 is of course actually located between the electronic module 22 and the electronic circuit board 12 and had to be omitted here in order to be able to show 22 above 12 in the first place.

A second, i.e. different, part of the electronic module 22 is disposed above the outer region 16 of the electronic circuit board 12 and there, by way of the at least one module connection port 20 or the connector 25 disposed thereon, is connected to the electronic circuit board 12. The electronic module 22 is therefore parallel to the electronic circuit board 12 and covers part of the outer region 16 by way of one part and part of the inner region 14 by way of another part, wherein the housing wall is located in the housing half between the inner part 14 and the electronic module, while the housing half 26 in the region covering the outer region 16 has an opening 37 for the connector 25 in order to connect the electronic module 22 to the module connection port 20.

FIG. 9A again shows a three-dimensional overall view of the configuration according to FIGS. 7 and 8, having two optional electronic modules (22), which are hidden here behind protective covers 33 thereof and can only be seen here by means of the optional connections 23. In comparison, FIG. 9B shows a design embodiment without optional electronic modules and with the receptacle 32 remaining open. On the one hand, it can readily be seen how the housing wall of the housing half continues to protect the inner region of the main electronic circuit board, even if the receptacle 32 per se remains open. According to a preferred refinement, however, a protective cover 36 is inside the receptacle 32 over the opening (37 obscured below 36) to the module connection port (20 likewise covered here).

Figure 10B:
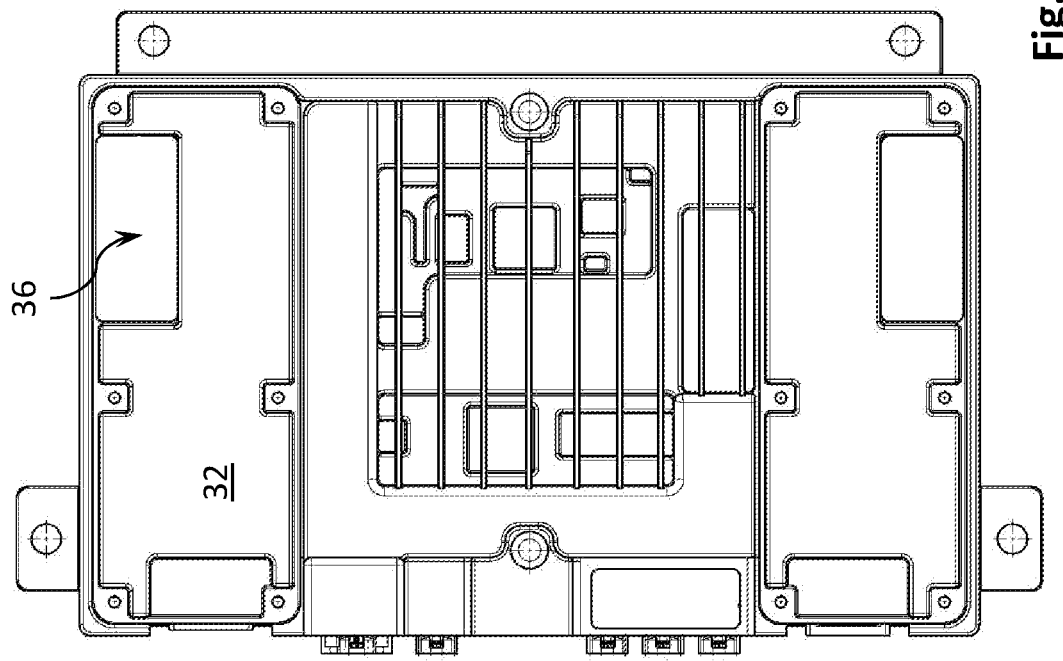
FIG. 10B shows a plan view of the design embodiment according to FIG. 9B
Figure 10A:
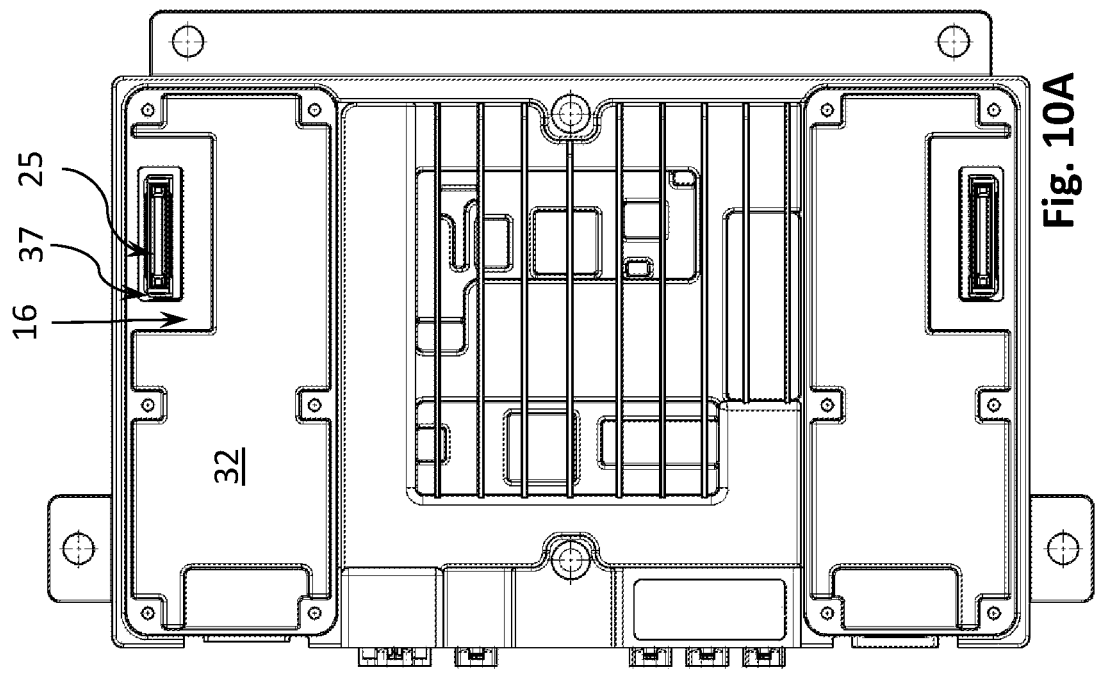
FIG. 10A shows a plan view of the design embodiment without optional electronic modules and the receptacle remaining open, still without a protective cover over the opening to the module connection port.

For this reason, FIG. 10A shows a plan view of the configuration without optional electronic modules and the receptacle 32 remaining open, still without a protective cover (36 omitted here) and thus the opening 37, per se obscured therebelow, in the housing wall to the module connection port 22 or the connector 25 disposed there. However, since in this situation environmental influences and EMC interferences could make their way at least into the outer region 16 of the main electronic circuit board 12, this opening 37 is preferably closed with the protective cover 36, as shown in FIG. 10B, specifically when the control unit 10 is to be marketed or operated without the optional electronic module.

A control unit having a housing as disclosed herein can be designed for an operating temperature range of −40° C. to +85° C., for example with the protection code IP42. A heat sink integrated in the housing can be made, for example, from AlSi9Cu3 die-cast aluminum. AlMg3 metal sheets can be used as a cover material. The cooling concept can be implemented actively (for example with a fan 23") and/or passively (for example with a heat sink 35 integrated in the housing half 26).

The concept of a modularly expandable electronic control unit described herein offers in particular the advantages and options listed below:

It is made possible to integrate an electronic module in an existing control unit, as a result of which the functionality of the main module of the control unit can be flexibly expanded.

Freedom from interference for EMC and thermal reasons can be guaranteed since the housing can shield the electronic circuit board of a control unit that implements a main module in relation to EMC and thermal influences, so that the behavior of the main module is not affected by an additional electronic module connected to the control unit by EMC or thermal influences. In particular, the "freedom from interference" according to ISO 26262 can thereby be guaranteed for safety-relevant applications in the vehicle.

Even after a control unit has been produced, one or a plurality of electronic modules can be added without having to strip the control unit housing to expose the electronic circuit board implementing the main module of the control unit, which could render a manufacturer's warranty void.

A high degree of flexibility is achieved. For example, a cooling fan instead of an additional system can thus optionally be integrated in the control unit.

LIST OF REFERENCE SIGNS

10 Control unit
12 Electronic circuit board
14 Inner region of the electronic circuit board
16 Outer region of the electronic circuit board
18 Closed (ground) conductor track on the electronic circuit board
20; 20''' Module connection ports on the electronic circuit board for connecting optional electronic modules (22)
20', 20'' Cable connection ports
22, 22' Optional electronic modules in receptacles (32) on the outside of at least one of the housing halves
23 Optional electrical plug-in connections on the optional electronic modules (22)
23'' optional fan
24, 26 Housing halves
25 Connector between the electronic circuit board (12) and the optional electronic module (22)
28, 30 shielding wall
32, 32' Receptacles for optional electronic modules (22) on the outside of the housing halves
33'', 33''' Protective covers for the plug-in connections 23 and the optional fan (23'')
34, 34' Receptacles for the cable connection ports 20', 20''
35 Heat sinks integrated in one of the housing halves
36 Protective cover within the receptacle (32) for the opening (37) to the module connection port (20) in the event that no electronic module (22) is fitted
37 Opening in the receptacle (32) of the housing half (26) for the connector (25) between the module connection port (20) and the electronic module (22)

The invention claimed is:

1. A modularly expandable electronic control unit comprising:
an electronic circuit board on which a conductor track is disposed on at least one side in a region of lateral edges, said conductor track enclosing an inner region of the at least one side and separating the inner region from an outer region of the at least one side, wherein at least one module connection port configured to electrically connect the electronic circuit board to at least one electronic module is disposed in the outer region;
a housing having two halves configured to receive the electronic circuit board, wherein at least one housing half has an encircling, at least partially electrically conductive shielding wall which in assembled state of the housing at least partially rests on the conductor track disposed on at least one side of the electronic circuit board, and causes electrical contact to be established between the conductor track and the at least partially electrically conductive shielding wall of the respective at least one housing half;

wherein the at least one housing half has at least one receptacle which for the at least one electronic module is accessible from outside the housing in the assembled state so that the at least one electronic module is able to be disposed on outside of the at least one housing half;

wherein the at least one receptacle is disposed so that the at least one electronic module which can be placed in the receptacle on the outside of the at least one housing half is able to be electrically connected to the at least one module connection port disposed in the outer region of the electronic circuit board; and wherein the electronic circuit board has electrical connections between the at least one module connection port and one or more electronic assemblies disposed on the inner region.

2. The modularly expandable control unit as claimed in claim 1, wherein a receptacle is formed on outside of a wall of the at least one housing half, wherein the wall of the at least one housing half is disposed in the receptacle between the at least one electronic module and the electronic circuit board.

3. The modularly expandable control unit as claimed in claim 2, wherein the at least one electronic module is disposed in the receptacle so that a first part of the at least one electronic module covers an inner region of the electronic circuit board, wherein the wall of the housing half there is located between the at least one electronic module and the electronic circuit board and a second part of the at least one electronic module is disposed above an outer region of the electronic circuit board and there is connected to the electronic circuit board by the at least one module connection port.

4. The modularly expandable control unit as claimed in claim 1, wherein the electronic circuit board is a multi-layer circuit board, wherein the electrical connections between the at least one module connection port and one or a plurality of electronic assemblies disposed on an inner region are embodied in one or a plurality of inner layers of the multi-layer circuit board.

5. The modularly expandable control unit as claimed in claim 1, wherein the electronic circuit board is configured to implement standard functions of the control unit, and the at least one module connection port by an electronic module connected thereto is configured to implement further functions of the control unit by the connected electronic module.

6. The modularly expandable control unit as claimed in claim 1, wherein said control unit is configured in such a manner that an electronic module connected to the at least one module connection port can be replaced without disassembling the housing halves of the housing of the control unit.

7. The modularly expandable control unit as claimed in claim 1, wherein at least one of the at least one receptacle is configured to accommodate an electronic module having a cooling element.

8. The modularly expandable control unit as claimed in claim 1, wherein protective covers are provided for the at least one receptacle and said protective covers are configured for attachment to one of the housing halves.

9. The modularly expandable control unit as claimed in claim 1, wherein at least one of the housing halves has an integrated heat sink for cooling at least one assembly disposed on the electronic circuit board.

10. The modularly expandable control unit as claimed in claim 1, wherein at least one cable connection port is disposed in an outer region of the electronic circuit board and the electronic circuit board has electrical connections between the at least one cable connection port and one or a plurality of electronic assemblies disposed on an inner region, wherein at least one housing half has one receptacle for each cable connection port.

11. The modularly expandable control unit as claimed in claim 10, wherein the at least one cable connection port is disposed in a corner region of the electronic circuit board, and each cable connection port is disposed in a corner region of the electronic circuit board such that an insertion direction of each cable connection port has an angle of approximately 45° to the lateral edges of the electronic circuit board in a lateral plane.

12. The modularly expandable control unit as claimed in claim 1, wherein as long as no electronic module is fitted in a receptacle on outside of the housing, a protective cover is provided which, disposed inside the receptacle, covers an opening to the at least one module connection port.

13. An electronic module configured to expand functionality of the modularly expandable control unit as claimed in claim 1 and has an electronic circuit board, wherein a connection port is disposed on one side of the electronic circuit board so when placing the electronic circuit board in a receptacle of a housing half of the control unit, the connection port electrically contacts the module connection port of the electronic circuit board of the control unit.

* * * * *